US005555253A

United States Patent [19]

Dixon

[11] Patent Number: 5,555,253
[45] Date of Patent: Sep. 10, 1996

[54] TECHNIQUE FOR LOCKING A LASER DIODE TO A PASSIVE CAVITY

[75] Inventor: George J. Dixon, Indian Harbor Beach, Fla.

[73] Assignee: Amoco Corporation, Chicago, Ill.

[21] Appl. No.: 481,192

[22] Filed: Jun. 7, 1995

Related U.S. Application Data

[63] Continuation of Ser. No. 370,508, Jan. 9, 1995, abandoned.

[51] Int. Cl.$^6$ ...................................................... H01S 3/13
[52] U.S. Cl. ........................... 372/29; 372/18; 372/108; 372/32; 372/94; 372/105; 372/100; 372/92; 372/102; 372/97
[58] Field of Search .................................. 372/29, 18, 102, 372/92, 22, 97, 98, 94, 105, 100, 108, 32

[56] References Cited

U.S. PATENT DOCUMENTS

| | | |
|---|---|---|
| 4,879,722 | 11/1989 | Dixon et al. . |
| 4,884,276 | 11/1989 | Dixon et al. . |
| 4,907,238 | 3/1990 | Chun et al. . |
| 5,027,361 | 6/1991 | Kozlovsky et al. . |
| 5,038,352 | 8/1991 | Lenth et al. . |
| 5,050,179 | 9/1991 | Mooradian . |
| 5,060,233 | 10/1991 | Harder et al. . |
| 5,084,840 | 1/1992 | Kozlovsky et al. . |
| 5,095,491 | 3/1992 | Kozlovsky et al. . |
| 5,142,542 | 8/1992 | Dixon . |
| 5,181,213 | 1/1993 | Shinokura et al. ........................ 372/97 |
| 5,301,059 | 4/1994 | Kitaoka et al. ............................ 372/22 |
| 5,351,121 | 9/1994 | Baer et al. . |
| 5,384,799 | 1/1995 | Osterwalder ............................ 372/32 |
| 5,392,308 | 2/1995 | Welch et al. ............................. 372/92 |
| 5,414,724 | 5/1995 | Zhou et al. ............................... 372/71 |
| 5,432,610 | 7/1995 | King et al. . |

OTHER PUBLICATIONS

Armstrong et al., "Interactions Between Light Waves In A Nonlinear Dielectric," *Phys. Rev.*, 127 (6), 1918–1938 (1961). Date not available.

Ashkin et al., "Resonant Optical Second Harmonic Generation and Mixing," *IEEE J. Quantum Electron.*, QE–2 (6), 109–123 (1966). Date not available.

Baumert et al., "Nonlinear Optical Effects In KNbO$_3$ Crystals at Al$_x$Ga$_{1-x}$As, Dye, Ruby and ND:YAG Laser Wavelengths," *SPIE (ECOOSA)*, 492 (Amsterdam) 374–385 (1984). Date not available.

Chang–Hasnain, "Characteristics of the off–centered apertured mirror external cavity laser array," *Appl. Phys. Lett.*, 54 (6), 484–486 (1989). Date not available.

Chang–Hasnain et al., "Diffraction–limited emission from a diode laser array in an apertured graded–index lens external cavity," *Appl. Phys. Lett.*, 49 (11), 614–616 (1986). Date not available.

Chang–Hasnain et al., "High power with high efficiency in a narrow single–lobed beam from a diode laser array in an external cavity," *Appl. Phys. Lett.*, 50 (21), 1465–1467 (1987). Date not available.

(List continued on next page.)

*Primary Examiner*—Leon Scott, Jr.
*Attorney, Agent, or Firm*—Leydig, Voit & Mayer, Ltd.

[57] ABSTRACT

A laser is disclosed whose resonant cavity includes a back facet of a semiconductor gain element as one mirror and a passive resonator as part of a second mirror. Appropriate optics are provided for a round-trip path within the resonant cavity that avoids double-passing the passive resonator so that intracavity losses are reduced and more power is fed back to the gain element, which is the active medium of the laser. By ensuring a high percentage feedback of the radiation to the semiconductor gain element, amplitude stable operation can be achieved while locking the frequency of the gain element to the passive resonator. By providing both frequency and amplitude stable operation, fluctuation of the circulating power in the passive resonator is minimized and, therefore, can be usefully employed for many applications. For example, non-linear crystals of well-known types can be placed within the passive resonator in order to achieve highly efficient second harmonic generation in a power regime and with frequency and amplitude stability that was heretofore unobtainable.

16 Claims, 7 Drawing Sheets

OTHER PUBLICATIONS

Cuthbertson et al., "Pump–resonant excitation of the 946–nm Nd:YAG laser," *Optics Lett.*, 16 (6), 396–398 (1991). Date not available.

Dahmani et al., "Frequency stabilization of semiconductor lasers by resonant optical feedback," *Optics Lett.*, 12 (11), 876–878 (1987). Date not available.

Dixon et al., "432–nm source based on efficient second–harmonic generation of GaAlAs diode–laser radiation in a self–locking external resonant cavity," *Optics Lett.*, 14 (14), 731–733 (1989). Date not available.

Fork et al., "A scanning spherical mirror interferometer for spectral analysis of laser radiation," *Appl. Optics*, 3 (12), 1471–1484 (1964). Date not available.

Gerstenberger et al., "Efficient second–harmonic conversion of cw single–frequency Nd:YAG laser light by frequency locking to a monolithic ring frequency doubler," *Optics Lett.*, 16 (13), 992–994 (1991). Date not available.

Goldberg et al., "Blue light generation by frequency doubling of AlGaAs broad area amplifier emissiion," *Appl. Phys. Lett.*, 60 (9), 1037–1039 (1992). Date not available.

Goldberg et al., "Broad–area high–power semiconductor optical amplifier," *Appl. Phys. Lett.*, 58 (13), 1357–1359 (1991). Date not available.

Goldberg et al., "Diffraction–limited broad stripe laser emission in an external resonator," presented at CLEO '89, FL6, 422–425 (1989). Date not available.

Goldberg et al., "Efficient generation at 421 nm by resonantly enhanced doubling of GaAlAs laser diode array emission," *Appl. Phys. Lett.*, 55 (3), 218–220 (1989). Date not available.

Goldberg et al., "Injection locking characteristics of a 1 W broad stipe laser diode," *Appl. Phys. Lett.*, 53 (20), 1900–1902 (1988). Date not available.

Goldberg et al., "21 W broad area near–diffraction–limited semiconductor amplifier," *Appl. Phys. Lett.*, 61 (6) 633–635 (1992). Date not available.

Goldberg et al., "12 W Broad Area Semiconductor Amplifier With Diffraction Limited Optical Output," *Electronics Lett.*, 27 (11), 927–929 (1991). Date not available.

Goldberg et al., "Single lobe operation of a 40–element laser array in an external ring laser cavity," *Appl. Phys. Lett.*, 51 (12), 871–873 (1987). Date not available.

Goldberg, et al., "3—3 W CW Diffraction Limited Broad Area Semiconductor Amplifier," *Electronics Lett.*, 20 (1992). Date not available.

Hall et al., "Progress Toward Phase–Stable Optical Frequency Standards," *Journal De Physique*, 42 (12–c8), 59–71 (1981). Date not available.

Hemmerich et al., "Second–harmonic generation and optical stabilization of a diode laser in an external ring resonator," *Optics Lett.*, 15 (7) 372–374 (1990). Date not available.

Jundt et al., "69% Efficient continuous–wave second–harmonic generation in lithium–rich lithium niobate," *Optics Lett.*, 16 (23), 1856–1858 (1991). Date not available.

Kean et al., "Efficient sum–frequency upconversion in a resonantly pumped Nd:YAG laser," *Optics Lett.*, 17 (2), 127–129 (1992). Date not available.

Kean et al., "Generation of 20 nW of blue laser radiation from a diode–pumped sum–frequency laser," *Appl. Phys. Lett.*, 63 (3), 302–304 (1993). Date not available.

Kleinman et al., "Infrared Detection by Optical Mixing," *J. Appl. Phys.*, 40 (2), 546–565 (1969). Date not available.

Kogelnik, "On the Propagation of Gaussian Beams of Light Through Lenslike Media Including those with a Loss of Gain Variation," *Appl. Optics*, 4 (12), 1562–1569 (1965). Date not available.

Kogelnik et al., "Laser Beams and Resonators," *Appl. Optics*, 5 (10), 1550–1566 (1966). Date not available.

Kozlovsky et al., "Efficient Second Harmonic Generation of a Diode–Laser–Pumped CW Nd:YAG Laser Using Monolithic MgO:LiNbO$_3$ External Resonant Cavities," *IEEE J. Quantum Electron.*, 24 (6), 913–919 (1988). Date not available.

Kozlovsky et al., "Generation of 41 mW of blue radiation by frequency doubling of a GaAlAs diode laser," *Appl. Phys. Lett.*, 56 (23), 2291–2292 (1990). Date not available.

Kozlovsky et al., "Resonator–enhanced frequency doubling in an extended–cavity diode laser," *Digest of the Compact Blue–Green Laser Topical Meeting, Postdeadline Paper Supplement*, PD2/1–PD2/3, (Optical Society of America, Washington, D.C., 1993). Date not available.

Mehuys et al., "1W CW, Diffraction–Limited, Tunable External–Cavity Semiconductor Laser," *Electronics Lett.*, 29 (14), 1254–1255 (1993). Date not available.

Mehuys et al., "2–0W CW, Diffraction–Limited Tapered Amplifier With Diode Injection," *Electronics Lett.*, 28 (21), 1944–1945 (1992). Date not available.

Polzik et al., "Frequency doubling with KNbO$_3$ in an external cavity," *Optics Lett.*, 16 (18), 1400–1402 (1991). Date not available.

Risk et al., "Efficient generation of blue light by doubly resonant sum–frequency mixing in a monolithic KTP resonator," *Optics Lett.*, 17 (10), 707–708 (1992). Date not available.

Shang et al., "Narrowband, high power light from diode lasers," *Appl. Optics*, 28 (9), 1618–1623 (1989). Date not available.

Siegman, "Laser Mirrors and Regenerative Feedback," in *Lasers*, Chapter 11, 408–440 (University Science Books, Mill Valley, CA, 1986). Date not available.

Siegman, "Stable Two–Mirror Resonators," in *Lasers*, Chapter 19, 761–767 (University Science Books, Mill Valley, CA, 1986). Date not available.

Tanner et al., "Atomic beam collimation using a laser diode with a self–locking power–buildup cavity," *Optics Lett.*, 13 (5), 357–359 (1988). Date not available.

Waarts et al., "High–power, cw, diffraction–limited, GaAlAs laser diode array in an external Talbot cavity," *Appl. Phys. Lett.*, 58 (23), 2586–2588 (1991). Date not available.

Yang et al., "6.5–W, 532–nm radiation by cw resonant external–cavity second–harmonic generation of an 18–W Nd:YAG laser in LiB$_3$O$_5$," *Optics Lett.*, 16 (19), 1493–1495 (1991). Date not available.

Yaeli et al., "Array mode selection utilizing an external cavity configuration," *Appl. Phys. Lett.*, 47 (2), 89–91 (1985). Date not available.

Kozlovsky et al., "Blue Light Generation By Resonator–Enhanced Frequency Doubling Of An Extended–Cavity Diode Laser", *Appl. Phys. Lett.* 65 (5), Aug. 1, 1994. Date not available.

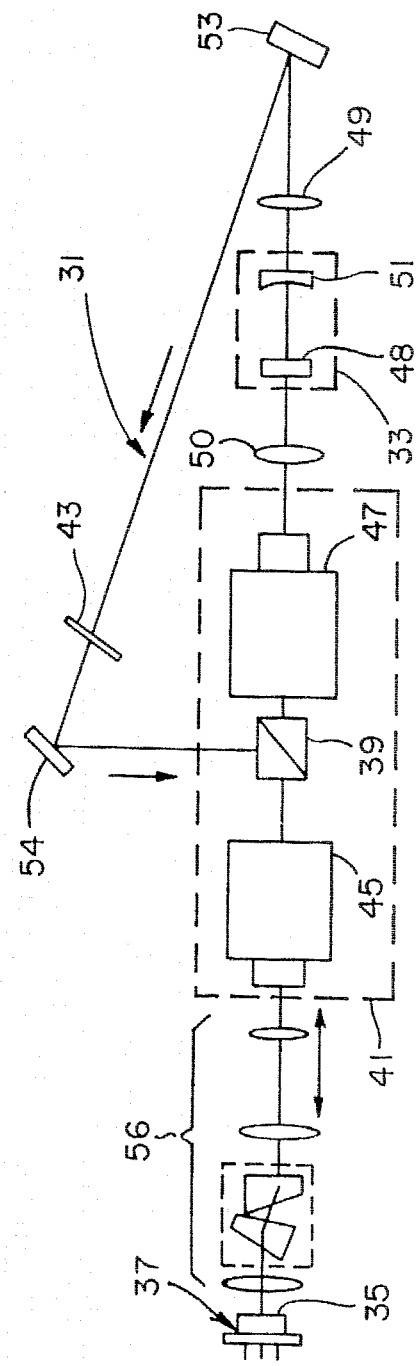
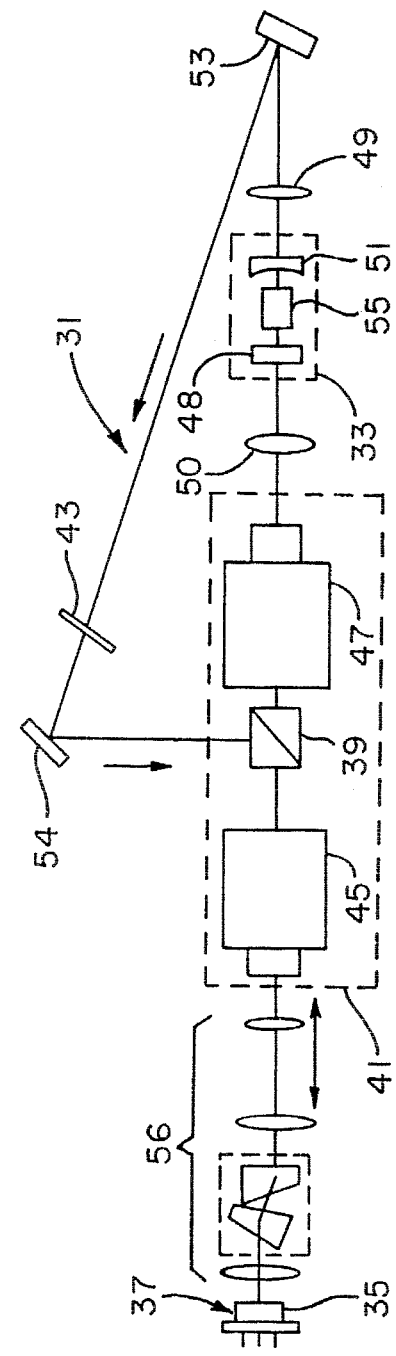
FIG. 6
FIG. 7

TECHNIQUE FOR LOCKING A LASER DIODE TO A PASSIVE CAVITY

This a continuation of application Ser. No. 08/370,508 filed on Jan. 9, 1995 now abandoned.

FIELD OF THE INVENTION

This invention relates to lasers of the type that employ semiconductor gain elements within a resonant cavity external to the element. More particularly, the invention relates to the use of optical feedback into the semiconductor gain element to enhance the coupling of the light from the semiconductor gain element into a passive optical cavity.

BACKGROUND OF THE INVENTION

Laser diodes are the most ubiquitous types of lasers available today. They are compact, rugged and relatively inexpensive. In general, however, laser diodes are characterized by low power outputs that limit their applications. Moreover, they typically operate in only the near-infrared portion of the spectrum. Output powers available from single-mode laser diodes such as single-stripe diodes are as high as two hundred milliwatts (mW), whereas the output powers available from multi-mode laser diodes such as laser diode arrays are on the order of tens of watts.

Because of their relatively low power outputs, it is known to use an external passive optical resonator to enhance the power of single stripe laser diodes. An example of resonant power enhancement of a single-stripe laser diode can be found in U.S. Pat. No. 4,884,276 to Dixon et al., wherein coherent radiation from a laser diode is focused along a beam path and injected into an external confocal Fabry-Perot optical cavity that contains a non-linear optical material, which results in the generation of a harmonic of the cavity radiation that is discharged through the output mirror of the passive cavity.

In a properly-designed passive optical resonator, it is possible to achieve power levels within the resonator that exceed the incident power from the laser diode by several orders of magnitude. This intracavity power multiplication can be used to increase the efficiency of non-linear optical processes (e.g., second harmonic generation, sum frequency generation, difference frequency generation and Raman processes) or resonantly pump a laser medium. Resonantly enhanced sum frequency and second harmonic generation are two of the methods currently being investigated as possible sources of efficient blue and green coherent light. Such lasers are needed for reprographics, video displays, optical data storage, biomedical diagnostics and many other applications. Resonant pumping is a method for improving the efficiency of quasi-three level lasers and pumping weakly-absorbing laser gain media.

The importance of resonant power enhancement of semiconductor-based lasers can be more fully appreciated by considering the second harmonic generation of a semiconductor laser diode in potassium niobate. Commercially available, diffraction-limited diode lasers operating near 860 nm have a maximum output power of approximately 150 mW. A single pass of 150 mW of output power through a five (5) millimeter (mm) crystal of potassium niobate results in output power at the second harmonic that is significantly less than 1 mW. However, if the same crystal is placed in a properly designed optical resonator, the intracavity field will have a power of greater than 10 watts. Because the harmonic efficiency increased linearly with input power, the output of the resonant device of the harmonic frequency can be as high as 70 mW. Thus, using the same laser diode and non-linear crystal, the harmonic output power is increased by 100 to 1000 times when a resonant cavity is employed.

In order to lock the frequency of a laser diode to the resonant frequency of an associated passive resonant cavity, two passive locking techniques employing optical feedback are known. The first of these techniques is commonly called "weak locking" in which a small fraction of the intracavity field of the passive resonant cavity is fed back to the diode laser. This technique is employed in the illustrated embodiment of the above-identified Dixon et al. patent.

In the "weak locking" technique, the ratio of feedback power to the diode laser output power is less than five (5) percent and, in practice, is usually below one (1) percent. This "weak locking" technique narrows the emission spectrum of the laser diode and locks its frequency to the passive cavity over a certain range of ambient conditions (e.g., temperature and vibration) that may effect the phase of the feedback radiation and the length of the optical cavity. However, the range of feedback phase and optical cavity length over which the laser diode and cavity remain locked is relatively narrow with respect to the range that can be expected in a typical commercial operating environment. For example, exposure to environmentally normal thermal variations and vibrations may result in the diode laser being unable to remain at all times locked to the cavity. As a result, an additional electronic feedback loop is required to keep the amplitude of the intracavity field constant in all but the most carefully controlled environments.

A second locking technique called "strong locking" is an improvement with respect to the "weak locking" technique in that it can lock the diode laser to the passive cavity regardless of changes in the phase of the feedback radiation and the length of the cavity. Thus, this "strong locking" technique overcomes the frequency instability problems experienced by the "weak locking" technique for devices operating in uncontrolled environments. In order to employ the "strong locking" technique, the output facet of the laser diode is usually anti-reflection coated (e.g., a reflectivity of below $10^{-3}$) and an optical feedback signal with an amplitude greater than five (5) percent of the diode laser output is imaged back into the diode facet. In effect, the addition of the anti-reflective coating to the output facet of the laser diode extends the resonant cavity formed within the semiconductor element of the diode. The external passive cavity is the equivalent output mirror for the extended resonator.

In the "strong locking" technique the passive cavity resonator functions as a transmission filter in the extended linear cavity. The light is double-passed through the passive resonator in order to feed back a portion of the light to the diode. This "strong locking" technique is disclosed in U.S. Pat. No. 5,038,352 to Lenth et al., wherein the light transmitted by the output mirror of the external cavity is reflected by a highly reflecting mirror back through the passive cavity to the laser diode. Even in this "strong locking" technique, however, an electronic feedback loop is required to control the wavelength of the laser diode.

More recently, this "strong locking" technique has been modified by replacing the electronic feedback loop with a frequency-selective diffraction grating. W. J. Kozlovsky, W. P. Risk and W. P. Lenth, "Resonator-Enhanced Frequency Doubling In An Extended Cavity Diode Laser," *Digest of the Compact Blue Green Laser Topical Meeting*, Addendum and Postdeadline Papers (Optical Society of America, Washington, 1993), Paper PD2. In this work, the optical feedback level was approximately three (3) percent. Although the "strong locking" technique employing a diffraction grating in substitution for an electronic feedback loop is highly effective in locking the frequency of the laser diode to a passive cavity for all possible values of feedback phase and cavity length, applicant has found that the amplitude of the harmonic output is characterized by a signal-to-noise ratio of approximately two to one. For most applications of resonant cavities pumped by laser diodes, an amplitude stability of less than one (1) percent is required.

Although applicant is unaware of any published experiments based on the "strong locking" techniques using an electronic feedback loop as described in the above-identified Lenth et al. patent, applicant's own experiments indicate that an electronic feedback loop cannot eliminate the frequency hopping that is characteristic of "strong locking" in the absence of a frequency selective element in the feedback path. With the use of such a frequency selective element, however, the "strong locking" technique is unable to produce an amplitude-stable field inside a high-finesse external resonator of the type required for the efficient generation of resonant second harmonics, resonant optical mixing or resonant pumping. For example, in second harmonic generators, instabilities in the field within the passive cavity are magnified in the harmonic output since the output is proportional to the square of the intracavity power. In order to produce the amplitude-stable, intracavity field required for practical device applications, improvements to the techniques employed for "strong locking" are needed.

In addition to double-passing the feedback radiation through the passive external cavity as taught in both the Lenth et al. patent and the Kozlovsky et al. publication, the Lenth et al. patent also describes a feedback scheme based on an L-shaped cavity for the external resonator. This configuration is identical to that of a Fox-Smith resonator used to force single mode oscillation of Argon ion and other lasers that normally operate in multiple longitudinal modes. Because the feedback signal is taken directly from the optical cavity, the feedback levels that can be achieved using this design are potentially much higher than those that can be obtained from the double-pass feedback technique.

Unfortunately, it is impossible to impedance match a Fox-Smith resonator and the coupling losses increase rapidly with the finesse of the cavity. In addition, the electronic wavelength control taught by the Lenth et al. patent is ineffective and a frequency selective element must be inserted between the diode and resonator in order to keep the diode emission within the spectral phase-matching bandwidth of the intracavity harmonic process. The insertion of a grating between the diode laser and the external cavity as taught by the Kozlovsky et al. publication can be expected to significantly reduce the amplitude of the feedback signal. The diffraction efficiency of a typical grating is between 60–80 percent. Thus placement of a grating between the diode and Fox-Smith resonator would reduce the fundamental field inside the resonator by 20 to 40 percent and the harmonic output of a resonant doubler by a factor of 40 to 64 percent. Because the feedback signal must be reflected twice by the grating in a Fox-Smith configuration, the amplitude of the optical feedback to the output facet of the diode would be reduced by a similar factor. As with the double-pass feedback scheme, it is difficult to obtain a feedback signal from a Fox-Smith configuration that is sufficiently strong to ensure stable operation.

SUMMARY OF THE INVENTION

It is the primary aim of the invention to concentrate the output power of laser diodes in a manner that maintains frequency and amplitude stability of the concentrated power without compensating electronics.

It is also an object of the invention to spatially and spectrally mode match the output radiation from a semiconductor gain element to an external passive resonator for the purpose of maximizing the concentration of the power from the output beam within the resonator.

It is a further object of the invention to provide a solid-state laser that is economic to manufacture while at the same time achieving the foregoing objectives and aim.

It is yet another object of the invention to provide a solid-state laser of the foregoing type that is compact and robust.

Briefly, the foregoing objectives are achieved by a solid-state laser whose resonant cavity includes one facet of a semiconductor gain element and a passive resonator. Appropriate optics are provided for a round-trip path within the resonant cavity that avoids double-passing the passive resonator so that intracavity losses are reduced and more power is fed back to the gain element, which is the active medium of the laser. By ensuring a high percentage feedback of the radiation to the semiconductor gain element, amplitude stable operation can be achieved while locking the frequency of the gain element to the passive resonator. By providing both frequency and amplitude stable operation, the concentration of power in the passive resonator can be usefully employed for many applications. For example, non-linear crystals of well-known types can be placed within the passive resonator in order to achieve highly efficient second harmonic generation in a power regime and with frequency and amplitude stability that was heretofore unobtainable.

While the invention will be described in some detail with reference to alternative preferred embodiments, it should be understood that it is not applicant's intention to limit the invention to such detail and embodiments. On the contrary, it is the applicant's intention to cover all alternatives, modifications and equivalents whether or not they are expressly described which fall within the spirit and scope of the invention as defined by the appended claims.

BRIEF DESCRIPTION OF THE DRAWINGS

FIG. 6 is an illustration of a solid-state laser according to the invention wherein the semiconductor gain element is an AR-coated single-stripe laser diode and both the extended cavity and the passive external resonator are linear;

FIG. 7 is a schematic illustration of a solid-state laser according to the invention wherein the semiconductor gain element is an AR-coated single-stripe diode laser whose extended cavity resonator and passive external resonator are both linear as in the embodiment of FIG. 6 but modified to include an intracavity birefringent filter within the passive cavity;

DETAILED DESCRIPTION OF THE PREFERRED AND EMBODIMENTS

Figure 1:
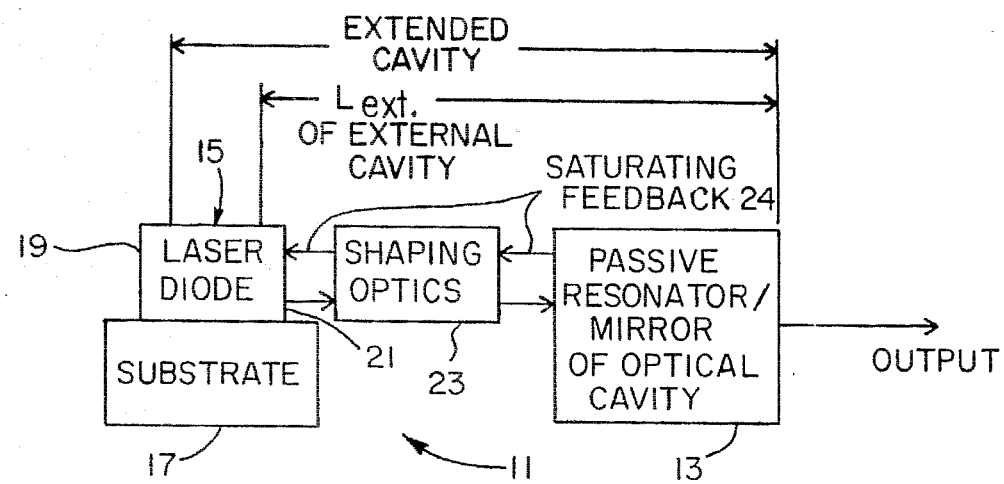
FIG. 1 is a highly schematic representation of a solid-state laser according to the invention wherein a resonant cavity of a laser diode is effectively extended beyond the output facet of the semiconductor gain element to include an external mirror having frequency-dependent reflectivity.

The basic operation of the amplitude-stable, optically-locked semiconductor diode laser of the invention can be understood by first referring to FIG. 1. According to the basic architecture of the illustrated embodiments of the solid-state laser of the invention, a semiconductor gain element 15 is a single stripe laser diode, having an anti-reflective (AR) coating on its output facet 21. Experimentally, applicant has employed a laser diode model HLP 1400 AR with an output reflectivity of less than $2 \times 10^{-4}$, sold by Joachim Sacher, Lasertechnik, Nikolaisti. 9A, D-35037, Marburg, Germany. A different diode may be appropriate for particular applications of the invention. For example, to accomplish frequency doubling a 150 mW IBM InGaAs diode with an output facet reflectivity of less than 0.1 percent and a wavelength of 994 nm is preferred.

One of the two mirrors defining the resonant cavity of the laser is the back facet 19 of the laser diode 15. In the highly schematic depiction of the solid-state laser of the invention in FIG. 1, the second mirror of the resonant cavity is an external mirror 13 with a wavelength-dependent reflectivity, $R_{ext}(\lambda)$, where $\lambda$ represents wavelength. By AR-coating the facet 21, the resonant cavity of the laser diode 15 is effectively extended to the external mirror 13. Thus, as referenced hereinafter, the "extended cavity" is a linear resonant cavity of the laser 11 of the invention, which is defined at one end by the back facet 19 of the laser diode 15 and by the external mirror 13 at the other end as shown in FIG. 1.

The laser diode 15 is mounted on a thermally conductive submount 17 for heat removal in a conventional manner. Also in a conventional manner, the back facet 19 of the diode 15 is coated for high reflectivity across the gain bandwidth of the diode and the front facet 21 is AR-coated for the wavelengths of the gain bandwidth. In all embodiments of this invention, the reflectivity of the AR-coated facet 21 is less than $10^{-3}$ (0.1%) across the gain bandwidth of the diode 15. Collimating and/or beam shaping optics 23 may consist of short focal length objective lenses, gradient index lenses, fiber lenses, anamorphic prism pairs or cylinder lenses. The optics 23 are inserted between the diode 15 and the mirror 13. These optics 23 are designed to minimize optical back-reflection to the diode 15 through a selected combination of tilted surfaces, AR coatings and mode matching. For example a combination of a Faraday isolator and polarizer may comprise a means to minimize the back-reflection. Alternatively, the external cavity can be designed to provide back-reflections that are not collinear with the feedback provided by the extended cavity.

The wavelength-dependent reflectivity $R_{ext}(\lambda)$ of the mirror 13 represents a feedback path 24 from a passive resonator to the AR-coated facet 21 of the laser diode 15. This feedback path returns to the laser diode 15 optical radiation, which is spectrally and spatially shaped by a resonant transmission effect, wavelength selectors, optical isolators, lenses and polarizers as explained more fully hereinafter. By increasing the intensity of the resonant transmission effect in the feedback path (i.e., increasing the value of $R_{ext}(\lambda)$ in FIG. 1), amplitude noise within the external cavity, $L_{ext}$ in FIG. 1, is substantially attenuated. Indeed, applicant's experimental results indicate that signal-to-noise ratios of less than two (2) percent can be achieved by the invention.

Figure 5:
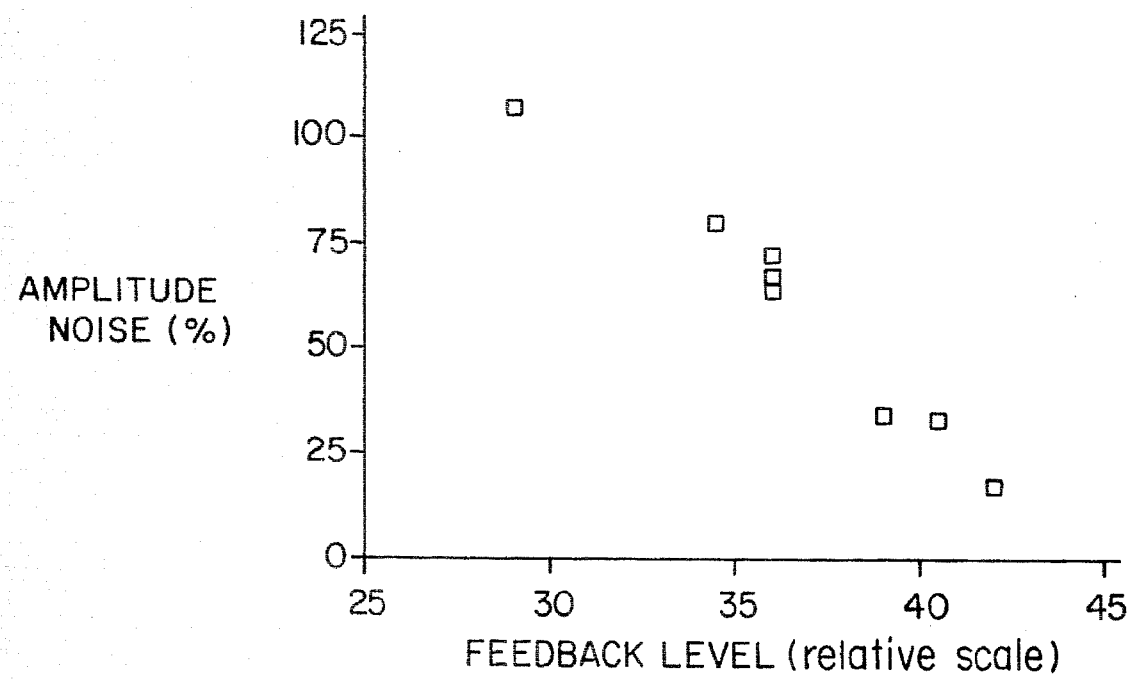
FIG. 5 is an exemplary graph illustrating the relationship between noise (i.e., frequency and amplitude jitters) in the circulating power of the extended resonator of the solid-state laser of FIG. 1.

FIG. 5 is an exemplary graph of the relationship between the amplitude of noise in the circulating power of the external cavity and relative value of the reflectivity, $R_{ext}(\lambda)$, of the mirror 13. As the graph clearly indicates, a high value of the reflectivity, $R_{ext}(\lambda)$, of the mirror 13 reduces the amplitude of the noise to levels that are acceptable for commercial applications. Preferably, the value of the reflectivity, $R_{ext}(\lambda)$, provides for the optical feedback to the AR-coated facet 21 of the diode 15 of at least five (5) percent of the radiation transmitted by the diode.

As explained more fully hereinafter, the output in FIG. 1 may be a percentage of the circulating power of the extended cavity. Alternatively, the output may be a percentage of the circulating power in the passive resonator resulting from second harmonic generation, frequency mixing or resonant pumping within the resonator.

Figure 2:
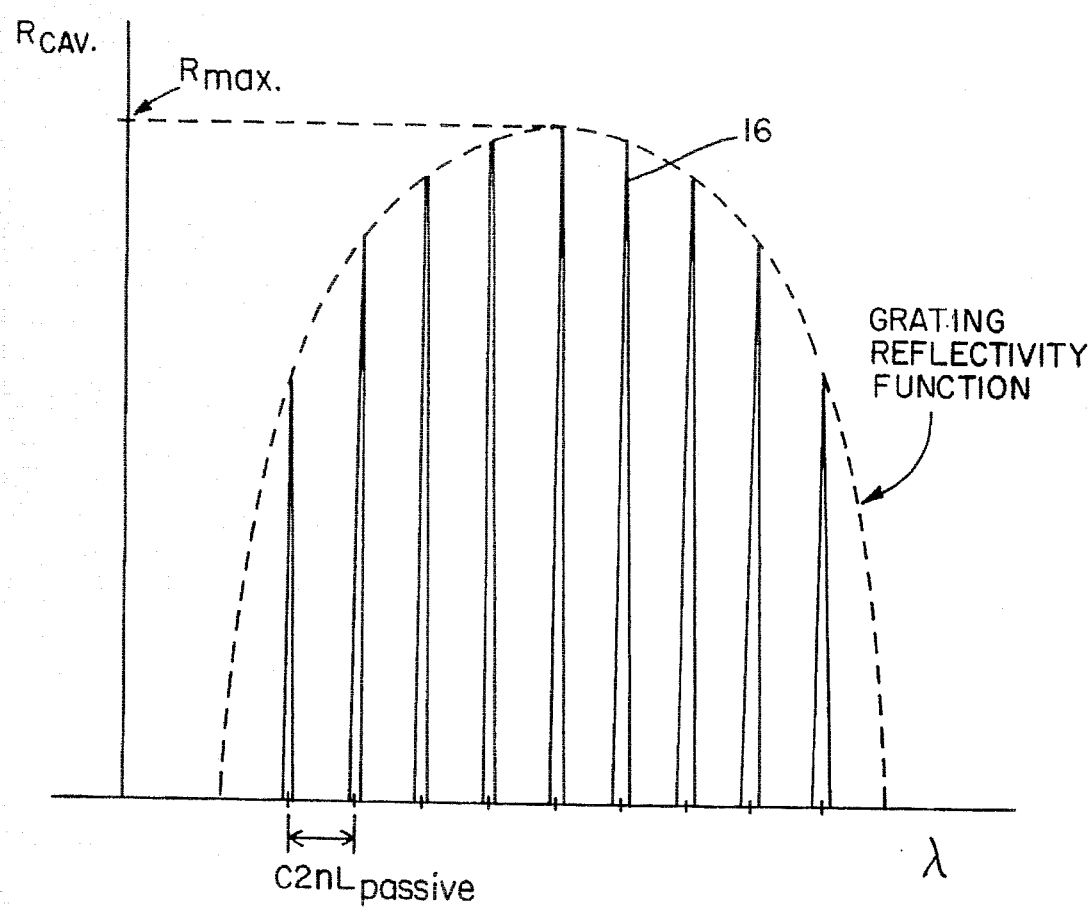
FIG. 2 is an exemplary graph illustrating the reflectivity of the external mirror in FIG. 1 with respect to frequency.

In one form of the invention, the external mirror 13 is a model for a combination of a diffraction grating and a passive resonator. As shown in the graph of FIG. 2, the overall reflectivity function $R_{ext}(\lambda)$ of the mirror 13 is the product of the reflectivity function $R_{grating}$ of the grating (shown in dashed line) and the resonant transmission function $R_{cavity}$ of the passive resonator, which includes a number of equally spaced resonant modes 16. As can be seen from the graph of FIG. 2, these functions combine such that one of the modes 16 of the passive resonator corresponds to the maximum reflectivity of the resonator grating.

The longitudinal modes 16 of the passive resonator have a frequency separation of approximately $c/2nL_{passive}$, where c is velocity of light, n is an average index of refraction within the resonator and $L_{passive}$ is the distance between the two mirrors (not shown in FIG. 1) of the passive resonator. The exact frequencies of the modes 16 of the passive resonator will vary with changes in the value of the length $L_{passive}$ of the cavity of the passive resonator caused by microphonics and changes in the ambient temperature. But the frequency of each mode will lie within a limited range, typically less than ten (10) gigahertz. Since the laser diode 15 is homogeneously broadened, the laser 11 is expected to operate at a wavelength of the mode of the passive resonator at the peak of the grating's reflectivity function as illustrated in the graph of FIG. 2.

Although the output facet 21 of the diode is AR-coated, its small reflectivity defines one end of a resonant cavity external to the laser diode 15. The second end of this cavity is formed by the external mirror 13. Hereinafter, this resonant cavity defined by the AR-coated output facet 21 on one side and the external mirror 13 on the other side is called "the external cavity," which has a length $L_{ext}$ as illustrated in FIG. 1. The source of this modulation is the etalon effect in the circulating power of the extended cavity caused by the AR-coated facet 21 of the diode laser 15 and the frequency dependent mirror 13.

Like the length $L_{passive}$ of the passive resonator, the length of the external cavity ($L_{ext}$) varies due to microphonics and variations in ambient temperature, causing the frequency and amplitude of the signal to jitter. Typically, this jittering is referred to as "technical noise" in the scientific literature. The effective reflectivity $R_{ext}(\lambda)$ of the external mirror 13 is modulated at audio frequencies by this etalon effect. In prior art devices, this modulation led to large amplitude instabilities in the intracavity fields of the extended cavities of passively locked diode lasers.

Figure 3:
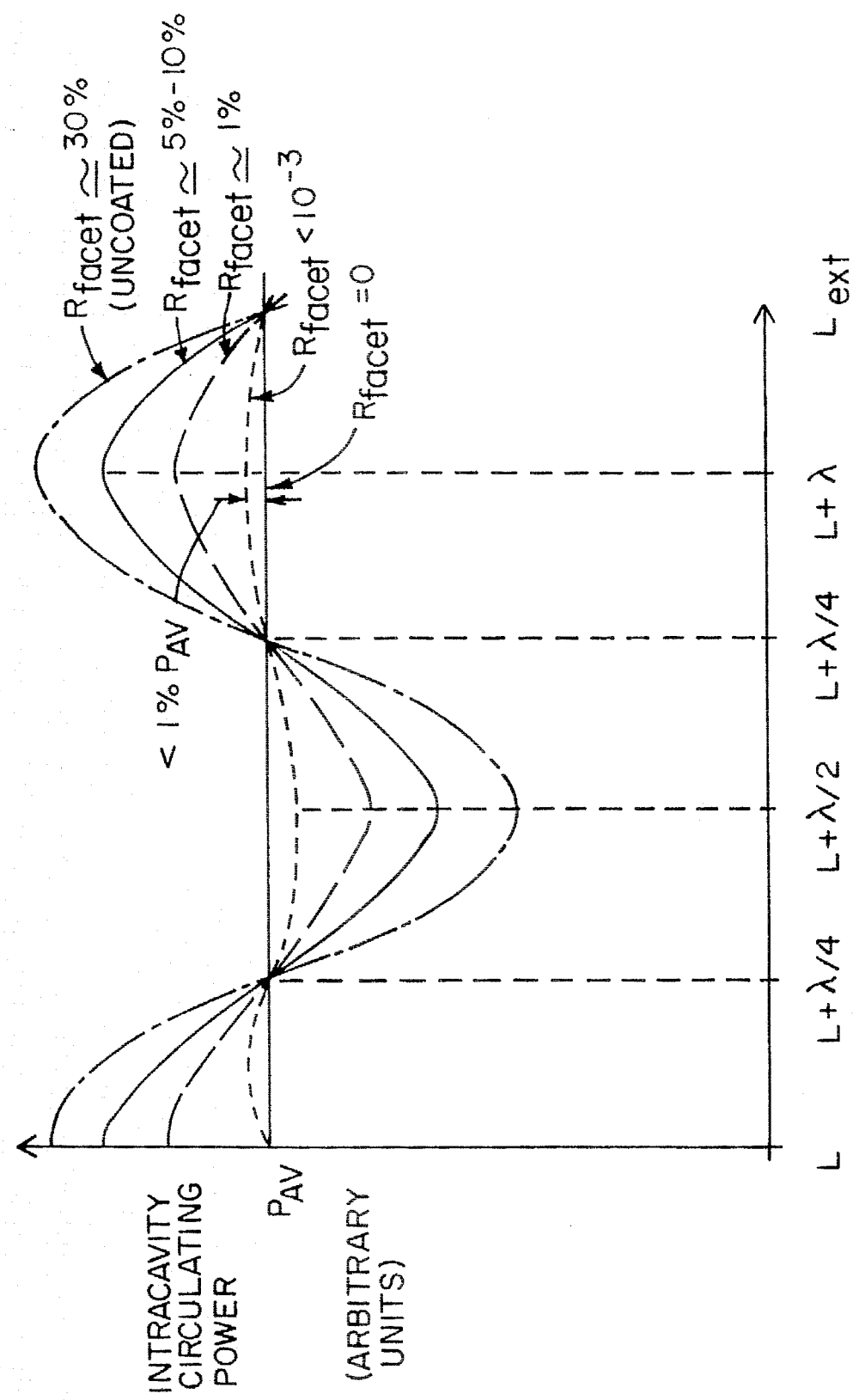
FIG. 3 is an exemplary graph illustrating the intracavity circulating power for the solid-state laser of FIG. 1 with respect to the spacing $L_{ext}$ between the output facet of the semiconductor gain element and the output mirror of the extended cavity for various values of the reflectivity $R_{facet}$ of the output facet of the gain element.

In a qualitative fashion, the waveforms in the graph of FIG. 3 show the effect of the reflectivity $R_{facet}$ of the output facet 21 of the laser diode 15 on amplitude noise in the circulating power of an extended cavity. As the reflectivity $R_{facet}$ of the output facet 21 is decreased, the magnitudes of the amplitude variations decrease. The waveforms in the graph of FIG. 3 assume the resonant transmission function $R_{cavity}$ is constant at approximately five (5) percent.

Figure 4:
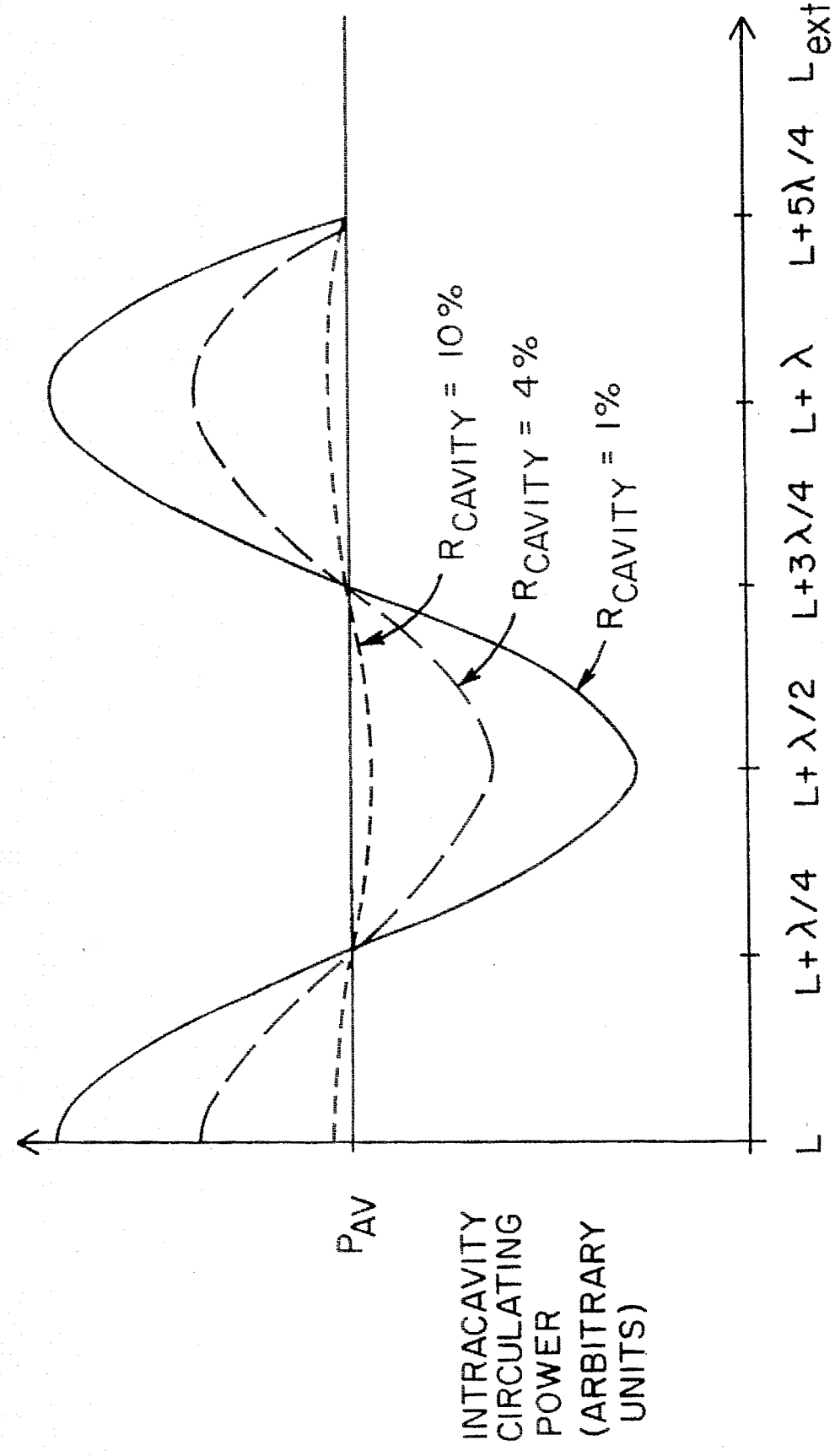
FIG. 4 is an exemplary graph illustrating the intracavity circulating power for the solid-state laser of FIG. 1 with respect to the spacing $L_{ext}$ between the output facet of the semiconductor gain element and the output mirror of the extended cavity for various values of the reflectivity $R_{ext}$ of the external mirror.

A similar result is obtained by increasing the amount of optical feedback, which corresponds to increasing the maximum value of the reflectivity $R_{ext}$ of the external mirror 13 in the graph of FIG. 2. Increasing the amount of optical feedback in effect decreases the relative variations in the reflectivity $R_{ext}$ of the mirror 13 caused by transient ambient conditions such as temperature changes and vibrations. Therefore, increased feedback further minimizes amplitude and frequency fluctuations in the circulating power. The expected variation of amplitude and frequency noise with feedback level is shown qualitatively the waveforms of the graph in FIG. 4, with the value of $R_{facet}$ fixed at 0.1 percent.

In keeping with the invention, it is desirable to minimize fluctuations in the effective reflectivity $R_{ext}$ of the external cavity by maximizing the ratio $R_{cavity}/R_{facet}$, where $R_{cavity}$ is the resonant transmission function of the passive resonator and $R_{facet}$ is the facet reflectivity of the diode 15, $R_{facet}$. While the applicant believes that a facet reflectivity of 0.1 percent coupled with a value of 50 for the ratio will reduce the amplitude fluctuations to an acceptable value, it has been found advantageous to reduce the facet reflectivity to the smallest value that can be practically achieved. Furthermore, it has been found that increasing the resonant transmission function $R_{cavity}$ to values significantly larger than five (5) percent is desirable since saturation effects in the gain medium (i.e., diode 15) at high feedback levels act to further minimize amplitude fluctuations.

Turning to a first embodiment of the invention, the laser in FIG. 6 includes a feedback path generally designated 31 for transmitting a significant fraction of the light concentrated within a passive resonator 33 back to an output facet 35 of a laser diode 37. The passive resonator comprises a flat input mirror 48 and a curved output mirror 51. The fraction of the intracavity field fed back to the diode 37 may only be 0.5 to ten (10) percent. However, the level of the optical feedback with respect to the output of the diode 37 is greater than five (5) percent. The light transmitted by the passive resonator 33 is reflected back to an output polarizer 39 of an optical isolator 41, which in turn reflects the optical feedback along a path collinear with the path of the incident light rejected by the passive resonator 33. A polarization rotator such as the half waveplate 43 in FIG. 6 is inserted in the feedback path 31 for the purpose of adjusting the polarization of the feedback radiation so that it is almost entirely transmitted by a Faraday isolator 45 and focused back into an output facet 35 of the laser diode 37. Optionally, a Faraday isolator (not shown) may be located in the feedback path 31 to eliminate direct back reflections to the diode laser 37 of rejected light sourcing from the polarizer 39. It is possible for light to be transmitted from the polarizer 39 to the output mirror 51 and reflected back to the diode laser 37 along the path 31. The isolator in path 31 will eliminate this source of instability. The reason that light may travel along the path 31 in the direction opposite to the arrows is that the polarizer 39 is imperfect and/or the beam from the diode laser 37 is not perfectly polarized.

A lens 49 such as a conventional spherical lens is provided as mode-matching optics in the feedback path 31 between the output mirror 51 of the passive optical resonator 33 and the Faraday isolator 47 in order to maximize the coupling of the feedback radiation into the active region of the laser diode 37. Also, a lens 50 such as a conventional spherical lens is provided as mode-matching optics between the optical isolator 41 and the passive resonator 33.

Preferably, the laser diode 37 has an anti-reflective (AR) coating on its output facet 35, giving the output facet a characteristic reflectivity $R_{facet}$ substantially below 0.1 percent. To complement the less than 0.1 percent reflectivity of the output facet 35 and ensure the gain of the laser diode 37 is saturated, the feedback radiation coupled into the laser diode is preferably greater than five (5) percent of the diode's output radiation. For example, if the output power is 100 mW, the power of the coupled feedback radiation should be five (5) milliwatts (mW) or more.

For most non-linear optical processes that may be performed in the passive resonator 33 in FIG. 6, it is necessary to narrow and stabilize the output spectrum of the laser diode 37 to keep it within the phase-matching bandwidth of the non-linear optical crystal in the passive resonator. A typical requirement is that the spectral width of the laser be less than 0.5 nm. Spectral narrowing of the emission from the laser diode 37 can be accomplished in several different ways. In the illustrated embodiment in FIG. 6, a diffraction grating 53 reflects the light transmitted by the passive resonator 33 back to the Faraday isolator 45. For stabilizing the output of a GaAlAs laser diode 37 to 810 nanometers (nm), the grating 53 is blazed at 780 nm and has a groove density of 1200 grooves/mm. It is also possible to use birefringent filters, transmission etalons, dielectric bandpass filters or a combination of these elements (not shown) in order to narrow and stabilize the output spectrum of the diode laser 37.

In general, a primary requirement of the elements external to the passive resonator 33 is that the transmission for out-of-band wavelengths be small. While diffraction gratings such as the grating 53 and bandpass filters meet this requirement, the losses associated with these devices are large when compared to those of an etalon or birefringent filter. Unfortunately, birefringent filters and etalons often have significant transmission at several wavelengths. In this connection, FIG. 7 illustrates the laser of FIG. 6 with a birefringent filter 55 placed inside the passive optical resonator 33 in order to function as a frequency selective element. By placing the filter inside the resonator 33, the filter is able to impose out-of-band losses on the circulating power. Because the light circulating in the resonator passes through the filter 55 multiple times, its ability to filter out-of-band radiation is enhanced. The in-cavity birefringent filter functions more effectively than the same element placed outside the cavity 33 because the power buildup inside the passive resonator is highly sensitive to intracavity loss. As an example, consider a resonant cavity that is impedance matched with a 2% input mirror. Maximum buildup in the cavity occurs when the sum of the intracavity losses is equal to the input mirror transmission, i.e., 2%. A significant increase in intracavity (and transmitted power) occurs if the intracavity losses are increased to 4%. Therefore, a 2% difference in transmission between peaks of a birefringent filter are highly significant if the filter is placed inside the resonator. If it were placed outside, the decrease of transmission from nearly 100% to 98% would be insignificant.

There are two mirrors 53 and 54 in the feedback path. These mirrors are both highly reflective for at the wavelength of the diode 37. The lenses and prisms 56 coupling diode 37 to the optical isolator 41 are for circularizing and collimating the output of the laser diode. They are the first stage in the optical train that matches the light entering and leaving the external optical cavity.

Figure 9:
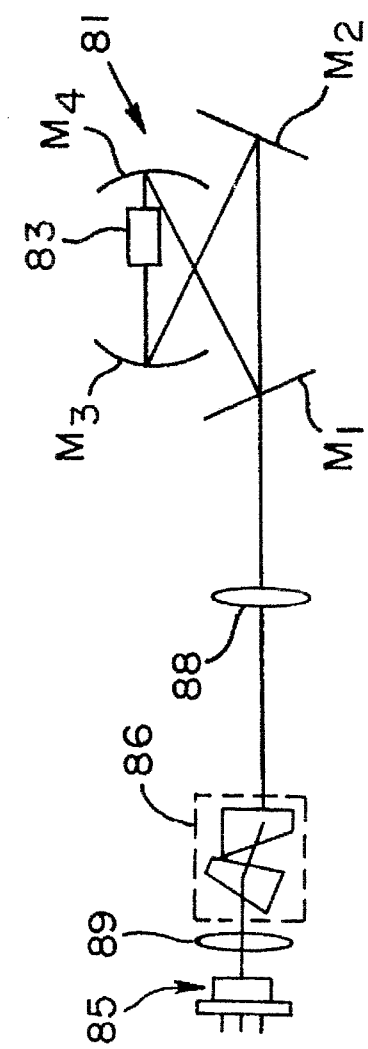
FIG. 9 is a schematic illustration of a solid-state laser according to the invention wherein the semiconductor gain element is an AR-coated single-stripe diode laser and the extended cavity and passive external resonator are linear and ring resonators, respectively.

In experiments performed by the applicant using the embodiment of FIG. 9, a significant decrease in the amplitude of noise in the circulating power of the passive resonator was noted when a single quantum well laser diode was replaced by a conventional heterostructure laser diode. Although the single quantum well laser diode in these experiments had a reflectivity at its output facet that was much smaller than that of the heterostructure laser diode, the amplitude of the noise was nevertheless significantly greater. Applicant believes that this increased noise in the single quantum well laser diode is due to the difficulties in stably coupling the feedback radiation from the external cavity into the smaller wave guide of the single quantum well laser diode.

In the embodiments of the invention illustrated in FIGS. 6 and 7, the mode-matching lens 49 must be in the path between the output mirror 51 of the passive resonator 33 and the Faraday isolator 45 in order to efficiently couple the feedback radiation to the laser diode 37. In order to mode match the feedback beam without the use of additional refractive elements such as the lens 49 in the embodiments of FIGS. 6 and 7, the diffractive path length between the mode-matching lens 50 and the output mirror 51 of the passive resonator 33 must be the same as the diffractive path length between the mode-matching lens and the input mirror 48 of the passive resonator.

Figure 8:
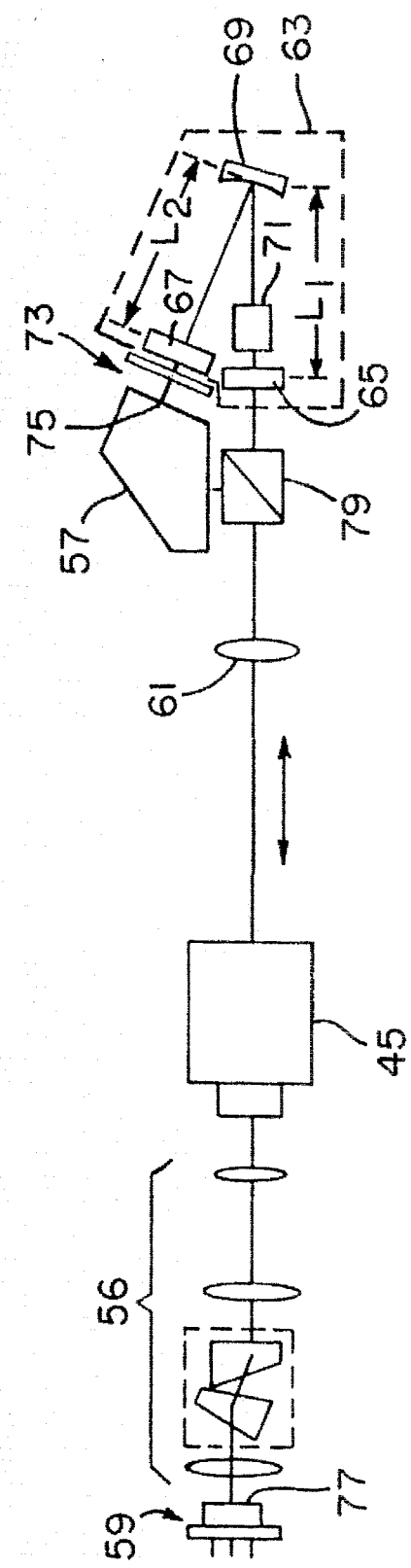
FIG. 8 is a schematic illustration of a solid-state laser diode according to the invention wherein the semiconductor gain element is an AR-coated single-stripe diode laser, with the extended cavity being linear and the passive external resonator being an L-shaped cavity containing an intracavity birefringent filter.

In the embodiment of the invention illustrated in FIG. 8, the feedback path in accordance with the invention includes an element 57, which automatically mode matches the feedback radiation to the laser diode 59 using a single mode-matching lens 61. The element 57 allows the mode matching lens 49 of the embodiments of FIGS. 6 and 7 to be eliminated. The optical element 57 has an index of refraction n greater than 1.00 is inserted into the feedback path to decrease the diffractive path length with respect to the physical distance between the output mirror 67 and the mode-matching lens 61. In general, the diffractive path lengths in the embodiment of FIG. 8 can be made to be equal as follows: the physical distance between the beam splitter 79 and the input mirror 65 of the passive resonator 63 is equal to the sum of (1) the physical length of the air gaps in the feedback path between the output mirror 67 of the passive resonator and the beam splitter 79 and (2) the physical length of the optical path through the optical element 57 divided by its index of refraction.

In the embodiment illustrated in FIG. 8, the passive resonator 63 consists of flat input and output mirrors 65 and 67, respectively, and a spherical bending mirror 69 that is used to produce a stable resonator. The passive resonator 63 is folded at the bending mirror 69 to have two arms of lengths $L_1$ and $L_2$ as illustrated. The output mirror 67 has a transmission at the input wavelength between 0.5 percent and 20 percent, while the transmission of the input mirror 65 is chosen to impedance match the other round-trip losses in the passive resonator (e.g., scattering, absorption, output mirror transmission and non-linear losses). The spherical bending mirror 69 is highly reflecting (e.g., R<99.7 percent) and has a concave radius that is less than the diffractive path length of the longer of the two arms of the passive resonator 63.

In the ideal case, the diffractive path lengths of the two arms of the passive resonator 63 are equal, producing beam waists at the input and output mirrors 65 and 67, respectively, that are the same size. The waist are of the same size because it enables one to obtain maximum coupling of the cavity transmission back to the diode laser with a single lens. If a birefringent filter 71 is included within the passive resonator 63, the diffractive path length of the arm including the filter is increased by an amount equal to $$L_3 - \frac{L_3}{n},$$

where $L_3$ is the physical length of the filter and n is its refractive index.

In order to complete the feedback path 73, the feedback beam is rotated 90 degrees relative to the input beam by a half waveplate 75, Fresnel Rohmb or other optical component, that changes the polarization direction of linearly polarized light. In keeping with the invention, this polarization rotator 75 can be placed on either the input or output side of the passive resonator 63. To image the feedback radiation into the output facet 77 of the laser diode 59, the polarization-rotated feedback beam is transmitted into a polarizing beam splitter 79 so that it counter-propagates along the path of the input beam toward the laser diode.

The same mode matching can be accomplished without additional refractive elements by inserting the optical element 57 inside the passive resonator 63 and making the physical distances between the beam splitter 79 and each of the two flat cavity mirrors 65 and 67 of the passive resonator equal to one another. In this case the two arms of the cavity are not equal. One sacrifices a litter in terms of mode matching efficiency but gains by not having to include the diffractive compensating element. As a further possible alternative, the optical element 57 can be removed if the L-shaped passive resonator 63 is designed in a way that the diffractive lengths between the two flat mirrors 65 and 67 and the mode matching lens 61 are equal. For this type of architecture, there will be a difference in the waist sizes at the input and output mirrors 65 and 67, respectively, of the passive resonator 63. Spot sizes are different because the lengths of the two resonator arms are different. But, this spot size difference will only reduce the coupled feedback level by a small amount if the output waist is accurately imaged on the output facet 77 of the laser diode 59. For example, a waist size ratio of 2.0 will lead to a reduction of coupled power of approximately 10 percent. The isolator and focusing lens in FIG. 8 play the same role as in other linear cavity designs. The only difference here is that the mode matching lens in the feedback path has been eliminated.

Referring to the preferred architecture of the invention illustrated in FIG. 9, a passive resonator 81 is in a form of a ring resonator comprising mirrors M1, M2, M3 and M4. The input mirror M1 of the passive resonator 81 has a reflectivity of approximately 98 percent. The other mirrors M2, M3 and M4 are all highly reflective at the wavelength of the diode 85—i.e., 994 nm. The output mirror M2 has a high transmission at a wavelength of 497 nm. In keeping with the invention, an intracavity element 83 such as a birefringent filter is used to generate a spectrally-filtered feedback signal to the laser diode 85. The intracavity element 83 is positioned so that one of its surfaces is coincident with a waist of the intracavity field and oriented normal to the optical axis of the resonator. Preferably, the laser diode 85 is a 150 mW IBM InGaAs diode with an output facet reflectivity of less than 0.1 percent and a wavelength of 994 nm. This diode is particularly well suited for use with KTP as a doubling crystal positioned within the passive resonator 81.

The birefringent filter 83 is oriented with its polarization axes at an acute angle with respect to the polarization of the input beam in order to spectrally filter the feedback radiation. The acute angle is in the plane normal to the direction of propagation of the intracavity field. Optimally, the surface of the birefringent filter 83, which is used to generate the reflective feedback to the laser diode 85, is spatially coincident with a waist of the passive resonator 81. As in the embodiments of FIGS. 6–8, the ring resonator embodiment of FIG. 9 includes an anamorphic prism pair 86 for circularizing and collimating the beam from the laser diode 85 before it is focused by the mode matching lens 88 into the passive ring resonator 81. The anamorphic pair is manufactured by Melles Griot, 1770 Kettering St., Irvine, Calif. 92714 (Cat. No. 06GPU001). The mode matching lens 88 is positioned so that the waist of the focused radiation input to the ring resonator 81 is coincident with the waist of the resonator's intracavity mode. Preferably, the focal length of the lens 88 is chosen to match the waist sizes of the input beam and the intracavity mode. Each of the lenses 88 and 89 is a molded aspherical collimating lens from Corning Glass.

The lens 88 in FIG. 9 is a mode matching lens like lens 61 in FIG. 8. A faraday isolator is not needed in the embodiment of FIG. 9 since there is no direct backreflection from the input mirror of the external resonator. An attractive property of ring resonators is the fact that the direct back-reflection is not collinear with the input beam.

By increasing the reflectivity of the surface of the intracavity element 83 located at the waist of the resonator 81, a portion (e.g., less than 15 percent) of the intracavity field will be coupled into a counter-propagating mode. This counter-propagating intracavity field is transmitted by the input mirror M1 and locks the laser diode to a resonant frequency of the extended cavity. A description of this technique, which employs only levels of feedback to establish weak locking of the diode, has been published by A. Hemmerich, et al., *Optics Letters*, 15, 372 (1990). In keeping with the invention, the intracavity field is maximized for those wavelengths at which the intracavity element 83 produces a full wave of retardation. Depending on the desired spectrum at which the laser is to be locked, multiple-plate intracavity elements may be employed in the ring resonator 81.

The reflective surface of the birefringent filter 83 has a reflectivity equal to the intracavity losses of the ring resonator 81, which is typically greater than one percent. Impedance matching is achieved by matching the transmission of the input mirror M1 of the ring resonator 81 to the sum of the reflective and intracavity losses of the ring. For example, in a cavity with intracavity losses of two percent, the reflective surface of the birefringent filter 83 provides two percent reflectivity of an incident beam and the input mirror of the ring cavity has a transmission of four percent. Under optimized spatial mode matching conditions, the radiation reflected by the birefringent filter 83 that is fed back to the laser diode 85 is approximately half as powerful as the input beam from the laser diode.

In accordance with the preferred embodiment of the invention, the birefringent filter 83 is a frequency doubling crystal such as KTP, which is oriented for non-critical Type II second harmonic generation of 994 nm input radiation. In Type II second harmonic generation (SHG), the intracavity polarization at 45° with respect the axes of the doubling crystal guarantees that the intracavity crystal acts as a birefringent filter. The transmission wavelength of the KTP is adjusted by controlling its temperature, using conventional techniques. Temperature control of the KTP crystal can be accomplished by mounting it in thermal contact with the surface of a thermoelectric cooler. The temperature of the crystal is monitored by a thermistor that is also in contact wit the surface of the cooler. To control the temperature, the resistance of the thermistor is compared to reference value and a feedback control circuit is used to adjust the temperature of the T. E. cooler so that the thermistor resistance (and the crystal temperature) is constant. In practice, the T. E. cooler can be easily replaced by a simple resistance heater.

In the architectures of prior art systems, passive resonators have typically required spatial mode matching of the input beam to the $TEM_{00}$ mode of the resonator for maximum power buildup. Unfortunately, the optical system for providing this mode matching typically has a transmission of 60 to 70 percent. As a result of this transmission loss, the power imaged into the passive resonator is significantly less than the power of the output beam from the laser diode. Thus, the power of the optical feedback coupled back to the laser diode is reduced correspondingly.

The requirement for spatial mode matching of the input beam to the passive resonator stems from the fact that the architecture of the typical resonator has its higher order transverse modes resonant at frequencies that are different than those of its fundamental transverse mode (i.e., the $TEM_{00}$ mode). This makes it impossible for the passive resonator to simultaneously excite multiple transverse modes with a single-frequency input beam. In a passively locked laser diode such as those of the present invention, the laser diode will typically lock to the transverse mode with the highest coupling to the input mode and radiation that is not matched to this mode is reflected from the input mirror of the passive resonator.

In keeping with the invention, the passive resonator may employ an architecture in which all of the transverse modes (i.e., the TEM modes) are at the same frequency. Such a passive resonator is commonly called a "degenerate resonator." With all of the transverse modes at the same frequency, it is possible to resonantly enhance an input beams that is not spatially mode matched to the fundamental $TEM_{00}$ mode of the passive resonator. By employing a degenerate resonator as the passive resonator in the present invention, the loss in mode-matching optics may be eliminated, thereby increasing both the input power to the passive resonator and the percentage of the radiation emitted by the laser diode that can be returned to it as optical feedback.

Degenerate resonators are described by J. A. Arnaud in "Degenerate Optical Cavities," *Applied Optics*, 8, 189 (1969).

Figure 10:
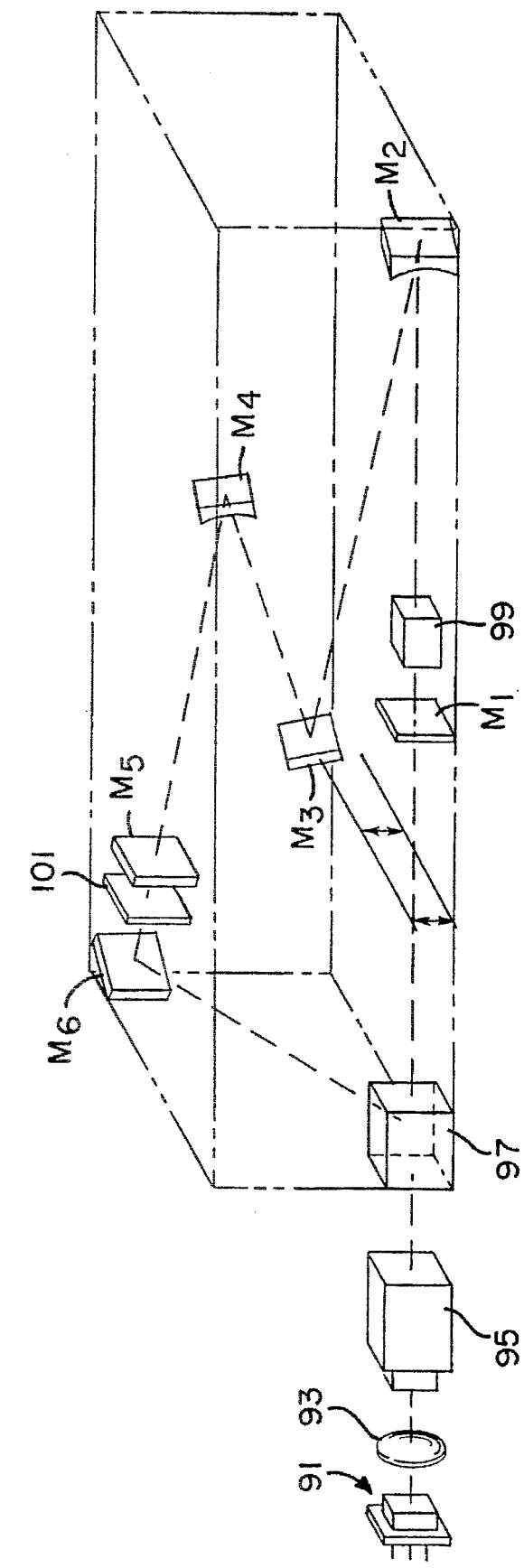
FIG. 10 is a perspective view of a linear cavity embodiment of a solid-state laser according to the invention wherein the semiconductor gain element is a single-stripe, AR-coated diode laser and the passive external resonator is a degenerate resonator.

Turning to FIG. 10, another embodiment of the invention is illustrated which incorporates the intracavity wavelength selection of the embodiment illustrated in FIG. 7, a degenerate optical resonator and the "automatic" techniques for mode matching the feedback radiation to the laser diode as illustrated in the architectures of FIGS. 8 and 9. In the embodiment of FIG. 10, a single stripe laser diode 91 preferably has a structure that is optimized for efficiently coupling feedback radiation from a linear passive resonator comprising mirrors M1, M2, M3, M4 and M5. The output of the laser diode 91 is imaged with a single lens 93 through a 45 degree Faraday rotator 95 and a polarizing beam splitter 97 onto the input mirror M1 of the linear passive resonator. For example, a Sharp LT015 laser diode with an AR coating on its output facet has a reflectivity below 0.2 percent provides an output beam that is imaged on the input mirror M1 with an 8.8 mm focal length Newport FL20 collimating lens. The Faraday rotator may be, for example, a NIR5, wavelength adjustable Faraday isolator with its input polarizer removed (manufactured by Optics For Research of Caldwell, N.J.).

In order to increase the coupling efficiency of the feedback radiation to the diode 91, it is desirable to eliminate astigmatisms in the output beam of the laser diode and focus the beam to a waist located at the coating of the input mirror M1. An astigmatism of the beam from the laser diode 91 can be eliminated by inserting a weak cylinder lens (not shown) between the spherical lens 93 and the linear passive resonator as generally indicated by the anamorphic prism pair 86 in the embodiments of FIGS. 6–8.

In the embodiment of FIG. 10, the linear passive resonator comprising mirrors M1, M2, M3, M4 and M5 is a degenerate resonator whose optical characteristics are designed according to the formalism detailed by Arnaud on pages 192–93 of his above-identified article. As illustrated in FIG. 10, the passive resonator contains a birefringent filter 99. As in the embodiment illustrated in FIG. 7, the use of the birefringent filter 99 as an intracavity element increases the out-of-band losses while maintaining a maximum transmission at the selected frequency of the filter. Of course, this technique requires the maximum transmission of the frequency selective element to be as close to 100 percent as possible, but this condition can be easily met using modern techniques of optical fabrication and coating. The birefringent filter 99 operates at normal incidence. Also, the optical path length along the two orthogonal crystal axes of the filter 99 must be equal in order to preserve the degeneracy of the passive resonator.

The three-dimensional arrangement of the mirrors M1 through M5 guarantees that the passive resonator is degenerate for all higher order transverse modes and not just those with the designation $TEM_{0n}$ or $TEM_{n0}$, where n is an integer. The reflectivities of the mirrors are selected so that 50 percent of the radiation incident on the input mirror M1 is transmitted by the output mirror M5. The transmission impedance of the input mirror matches the other intracavity losses. For example, in a cavity with intracavity losses of approximately 1.5 percent, the put mirror M5 has a transmission equal to these losses (i e., 1.5 percent) and the input mirror M1 has a transmission equal to the sum of the output transmission and the intracavity losses (i.e., three (3) percent).

The spectrally-filtered feedback radiation emerging from the output mirror M5 is directed through a 90 degrees polarization rotator 101 (e.g., a half waveplate oriented with axes at 45 degrees to the input radiation). The rotator 101 aligns the feedback beam so that its transmission through the polarizer 97 is maximized and it is spatially overlapped with the input beam but propagating in the opposite direction. A highly reflective mirror M6 directs the feedback beam into the polarizer 97 The distance between the output mirror M5 and the polarizer 97 is adjusted so that the diffractive path length from the focusing lens 93 to the input mirror M1 is equal to the length from the output mirror M5 to the lens. When the various optical elements are properly aligned, the feedback radiation from the passive resonator is automatically mode matched to the active waveguide of the diode laser 91 by the focusing lens 93.

As will be appreciated by those skilled in the art of laser design, the embodiments of the invention illustrated FIGS. 6–10 are only representative of particular employing the concepts of the invention to the amplitude stability of the circulating p for a passively locked laser diode. Depending on application, satisfactory amplitude stability may be achieved by using only one of the techniques, a suggested by the embodiment in FIG. 6. In other applications, several techniques may be used in concert as in the embodiment of FIG. 10. In any case, the following claims are intended to cover all such embodiments regardless of the application. By providing strong locking of the diode laser using the techniques disclosed her, in, the amplitude noise in the circulating power of a passive resonator is substantially reduced, thereby enabling practical and efficient second harmonic generation, frequency mixing and resonant pumping.

I claim as my invention:

1. A laser comprising in combination:

a semiconductor gain element having back and front facets and generating optical radiation at the front facet;

an anti-reflective coating on the front facet of the semiconductor gain element;

an extended cavity comprising first and second opposing mirrors, where the first mirror is the back facet of the semiconductor gain element and the second mirror has a reflectivity $R_{ext}$ and comprises a passive resonator physically separated from the gain element for storing as circulating power the optical radiation emitted through the front facet of the gain element;

an optical coupling for introducing the optical radiation from the gain element into the passive resonator, including a means for preventing the gain element from receiving radiation backreflected by the passive resonator as a result of the impedance mismatch between the gain element and the passive resonator;

a feedback path for returning to the semiconductor gain element a portion of the circulating power of the passive resonator;

means in the feedback path for maintaining fluctuations in the amplitude of the circulating power below five (5) percent of an average value of the circulating power; and an optical filter for spectrally filtering the portion of passive radiation fed back to the gain element.

2. The laser as set forth in claim 1 wherein the means in the feedback path is a ratio $$\frac{R_{cavity}}{R_{facet}},$$

whose value is greater than fifty (50), where $R_{facet}$ is the reflectivity of the output facet of the semiconductor gain element and $R_{cavity}$ is a resonant transmission function of the passive resonator.

3. The laser of claim 2 where the passive resonator is a ring resonator.

4. The laser as set forth in claim 3 wherein the passive resonator includes an input mirror and an output mirror and the feedback path includes a reflective surface within the optical cavity for reflecting back through the input mirror the portion of the optical radiation that maintains the amplitude fluctuations below five (5) percent of the average value of the circulating power.

5. The laser as set forth in claim 2 wherein the optical filter is a birefringent filter.

6. The laser as set forth in claim 2 wherein the optical filter is a prism.

7. The laser as set forth in claim 2 wherein the resonant transmission function $R_{cavity}$ of the passive resonator is approximately five (5) percent or more and the reflectivity $R_{facet}$ of the output facet of the semiconductor gain element is approximately 0.1 percent or less.

8. The laser as set forth in claim 1 wherein the means in the feedback path is a resonant transmission function $R_{cavity}$ of the passive resonator that returns more than five (5) percent of the optical radiation from the semiconductor element.

9. A laser as set forth in claim 1 wherein the means in the feedback path is a reflectivity $R_{facet}$ that is less than 0.1 percent.

10. The laser as set forth in claim 1 wherein the semiconductor gain element is a single stripe laser diode.

11. The laser as set forth in claim 1 wherein the portion of the circulating power in the feedback path is an output beam transmitted by an output mirror of the passive resonator and the feedback path includes means for spatially mode matching the optical radiation in the feedback path to the semiconductor gain element.

12. The laser as set forth in claim 11 wherein at least a portion of the optical coupling that introduces the optical radiation from the semiconductor gain element into the passive resonator is part of the feedback path for returning to the gain element the portion of the circulating power stored in the passive resonator.

13. The laser as set forth in claim 12 including a beam splitter in the feedback path for coupling into the portion of the optical coupling in the feedback path the portion of the circulating power transmitted by the output mirror of the passive resonator.

14. The laser as set forth in claim 1 wherein the optical filter is within the passive resonator.

15. The laser as set forth in claim 1 wherein the passive resonator is a degenerate optical cavity.

16. The laser as set forth in claim 1 wherein the passive resonator is a linear cavity.

* * * * *